(12) United States Patent
Beaumont et al.

(10) Patent No.: US 7,445,673 B2
(45) Date of Patent: Nov. 4, 2008

(54) MANUFACTURING GALLIUM NITRIDE SUBSTRATES BY LATERAL OVERGROWTH THROUGH MASKS AND DEVICES FABRICATED THEREOF

(75) Inventors: Bernard Beaumont, Valbonne (FR); Jean-Pierre Faurie, Valbonne (FR); Pierre Gibart, Chateauneuf-Grasse (FR)

(73) Assignee: Lumilog, Vallauris (FR)

( * ) Notice: Subject to any disclaimer, the term of this patent is extended or adjusted under 35 U.S.C. 154(b) by 64 days.

(21) Appl. No.: 10/556,316

(22) PCT Filed: May 18, 2004

(86) PCT No.: PCT/IB2004/001914

§ 371 (c)(1),
(2), (4) Date: Nov. 9, 2005

(87) PCT Pub. No.: WO2004/105108

PCT Pub. Date: Dec. 2, 2004

(65) Prior Publication Data

US 2006/0266281 A1     Nov. 30, 2006

(51) Int. Cl.
*C30B 29/38* (2006.01)
*C30B 25/00* (2006.01)
*C30B 28/12* (2006.01)

(52) U.S. Cl. .............................. 117/94; 117/95; 117/96; 117/97; 117/952

(58) Field of Classification Search ............. 117/94–97, 117/952
See application file for complete search history.

(56) References Cited

U.S. PATENT DOCUMENTS 6,051,849 A * 4/2000 Davis et al. ................. 257/103
6,111,277 A * 8/2000 Ikeda .......................... 257/99
6,316,785 B1 * 11/2001 Nunoue et al. ................ 257/14
6,325,850 B1 * 12/2001 Beaumont et al. ............. 117/95
6,802,902 B2 * 10/2004 Beaumont et al. ............. 117/95

(Continued)

FOREIGN PATENT DOCUMENTS

EP     1 291 904 A     3/2003

(Continued)

OTHER PUBLICATIONS

Beaumont B et al., MRS Internet Journal of Nitride Semiconductor Research, vol. 3, 1998, p. 3.

*Primary Examiner*—Robert M. Kunemund
*Assistant Examiner*—G. Nagesh Rao
(74) *Attorney, Agent, or Firm*—Birch, Stewart, Kolasch & Birch, LLP

(57) ABSTRACT

Gallium nitride substrates are grown by epitaxial lateral overgrowth using multiple steps. On a masked substrate having openings areas, selective growth produces first triangular stripes in which most of the threading dislocations are bent at 90°. In a second step, growth conditions are changed to increase the lateral growth rate and produce a flat (0001) surface. At this stage the density of dislocations on the surface is <5×107 cm 2. Dislocations are primarily located at the coalescence region between two laterally grown facets pinching off together. To further decrease the dislocation density a second masking step is achieved, with the openings exactly located above the first ones. Threading dislocations (TDs) of the coalescence region do not propagate in the top layer. Therefore the density of dislocations is lowered below <1×107 cm lover the entire surface.

24 Claims, 11 Drawing Sheets

U.S. PATENT DOCUMENTS

| | | | |
|---|---|---|---|
| 7,118,929 B2 * | 10/2006 | Frayssinet et al. | 438/22 |
| 2001/0039104 A1 | 11/2001 | Ito et al. | |
| 2003/0032288 A1 | 2/2003 | Kozaki et al. | |
| 2003/0062529 A1 | 4/2003 | Suehiro et al. | |

FOREIGN PATENT DOCUMENTS

| | | |
|---|---|---|
| EP | 1 403 912 A1 | 3/2004 |
| WO | WO-01/80311 A | 10/2001 |
| WO | WO-02/099859 A | 12/2002 |

* cited by examiner

MANUFACTURING GALLIUM NITRIDE SUBSTRATES BY LATERAL OVERGROWTH THROUGH MASKS AND DEVICES FABRICATED THEREOF

1. BACKGROUND OF THE INVENTION

1.1. Field of the Invention

The present invention concerns high quality gallium nitride wafers suitable for the subsequent growth of efficient devices structures and a method of manufacture thereof.

1.2. Description of the State of the Art

Blue-Violet laser diodes (LDs) based on GaInN MQWs cw operating at room temperature were demonstrated in late 1995. The active structure was grown on sapphire by Metal Organic Vapour Phase Epitaxy (Jpn. J. Appl. Phys, 35, L74 (1996)). However these first LDs with threading dislocations (TDs) densities on the GaN/sapphire substrate between $10^8$ and $10^9$ $cm^{-2}$ suffer from degradation. The operating lifetime of these blue-violet laser diodes could reach 10000 hours when the density of dislocations in the GaN wafers used for the fabrication of LDs structures went below $10^7$ $cm^{-2}$. These low dislocations densities have been indeed reached using the Epitaxial Lateral Overgrowth (ELO) technology. The ELO technology can be described as follows: first, a few μm thick GaN layer is grown on sapphire or 6H—SiC. Next a dielectric ($SiO_2$ or SiN) mask is deposited using well-established technologies like CVD or PECVD. Using standard photolithographic techniques, a set of parallel stripes, separated by window areas, is opened in the mask. During the initial regrowth, either in MOVPE (T. S. Zheleva, O.-H. Nam, M. D. Bremser, R. F. Davis, Appl. Phys., 71, 2472 (1997)) or HVPE [A. Sakai, H. Sunakawa, and A. Usui, Appl. Phys. Lett. 71, 2259 (1997).] or even sublimation growth, (S. Kurai, K. Nishino, S. Sakal, Jpn. J. Appl. Phys., 36, L184(1997)) selective area epitaxy is achieved. This means that the subsequent growth is initiated in the windows without any nucleation on the dielectric mask. Under proper conditions and once the GaN growing film reaches in the stripes, the mask level, epitaxial lateral growth over the mask starts and finally leads to a full coalescence and to a smooth surface suitable for device fabrication. The basic idea is that this technique may lead to a filtering of the defects: above the windows, the microstructure of the underlying GaN template is reproduced, whereas the laterally grown material (over the mask) is defect free. The masked areas stop the propagation of threading dislocations that arise from the template, since lateral growth proceeds from TD free vertical facets.

Currently, two main ELO technologies exist: the simpler one involves a single growth step on the striped opening. In this one-step-ELO (1S-ELO), growth in the opening remains in registry with the GaN template underneath (coherent part), whereas GaN over the mask extends laterally (wings) (FIG. 2). In this method, however, some parts of the surface remain highly defective (coherent part above the openings and coalescence boundaries). This makes the technology of LDs on ELO also complicated since device structures have to be fabricated on the good part of the template over layer and thereby the yield of fabrication is low.

Conversely, in the two-step-ELO (2S-ELO) process (FIG. 3), the growth conditions of the first step are monitored to obtain triangular stripes. This technique is well described for example in U.S. Pat. No. 6,325,850. Inside these stripes, the threading dislocations arising from the templates are bent by 90° when they encounter the inclined lateral facet. In the second step, the growth conditions are modified to achieve full coalescence. In this two-step-ELO, only the coalescence boundaries are defective. In the 2S-ELO technology, TDs densities are reduced to about $10^7$ $cm^{-2}$. Indeed, the bending of dislocations at 90° is a key feature which in the 2S-ELO reduces the TDs density beyond the simple blocking by the mask. When the dislocations meet the {11-22} lateral facet, their line is submitted to two kinds of forces, one acts to keep the line so normal to the surface, whereas the second term acts to align the dislocation with its Burgers vector.

2. SUMMARY OF THE INVENTION

The present invention aims to provide a method of manufacturing GaN substrate in which the TDs density has been lowered over the entire surface, thereby making it suitable for LDs fabrication. According to the present invention, the substrate comprises a mask in which opening areas have been formed. Growth occurs selectively by way of the mask layer. The mask layer and the selective growing layer have been disposed on two or more layers alternatively. The subsequent masks are placed exactly parallel on top of each other.

In this method, the two-step-ELO technology is used (2S-ELO described in U.S. Pat. No. 6,325,850). The process produces layers in which remaining dislocations are located in the coalescence boundaries, in the middle of the masked area. The second mask being located exactly on top of the first one prevents the propagation of these remaining dislocations. Conversely to processes described in U.S. Pat. No. 6,051,849 Davis et al, 1999, WO 99/44224, Davis et al, 1999, U.S. Pat. No. 6,111,277, Ikeda, 2000, U.S. Pat. No. 6,015,979, Sugiara et al, (2000), US2001/0003019A1, where the second mask must be offset with respect to the first one, in the present invention, the two masks must be exactly on top of each to stop the propagation of TDs at the coalescence boundaries.

3. DESCRIPTION OF THE ACCOMPANYING DRAWINGS

Several embodiments of the process according to the invention will now be described in relation with the figures and the examples.

Figure 4:
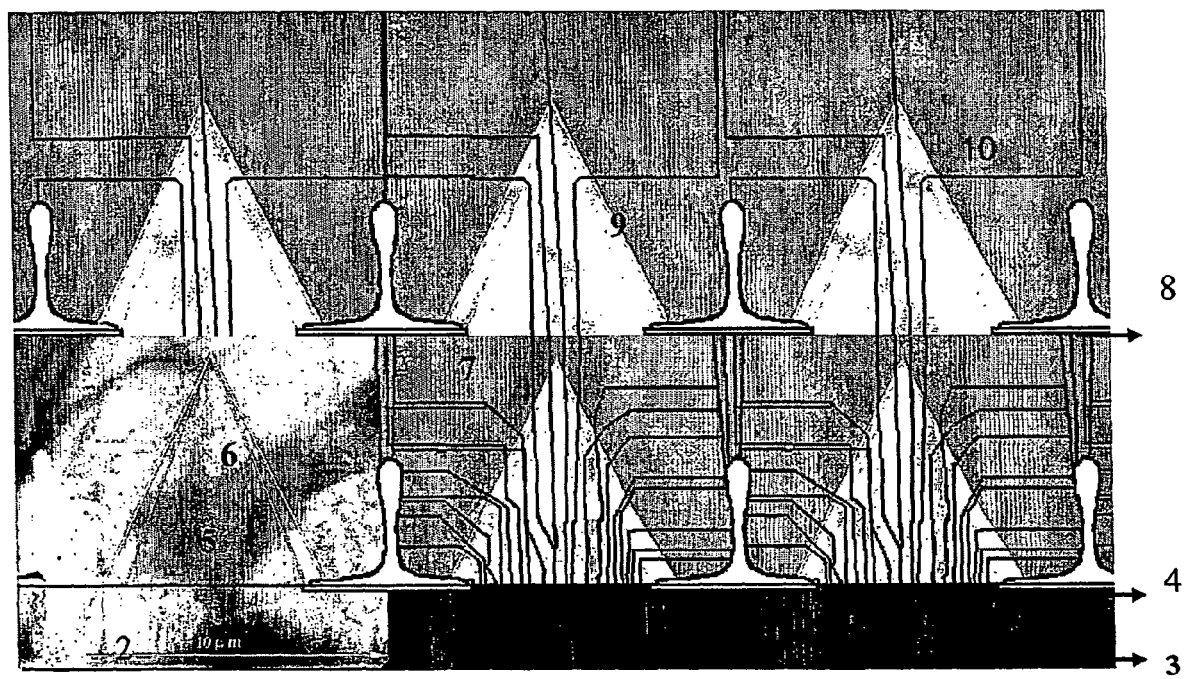

FIG. 4 is a schematic cross-sectional view of GaN grown first by the two-step method in MOVPE, then grown on a mask pattern exactly in registry with the first mask set. The second regrowth is also a two-step process. The lowest left part corresponds to a TEM image of GaN grown according to the two-step-ELO.

Figure 5:
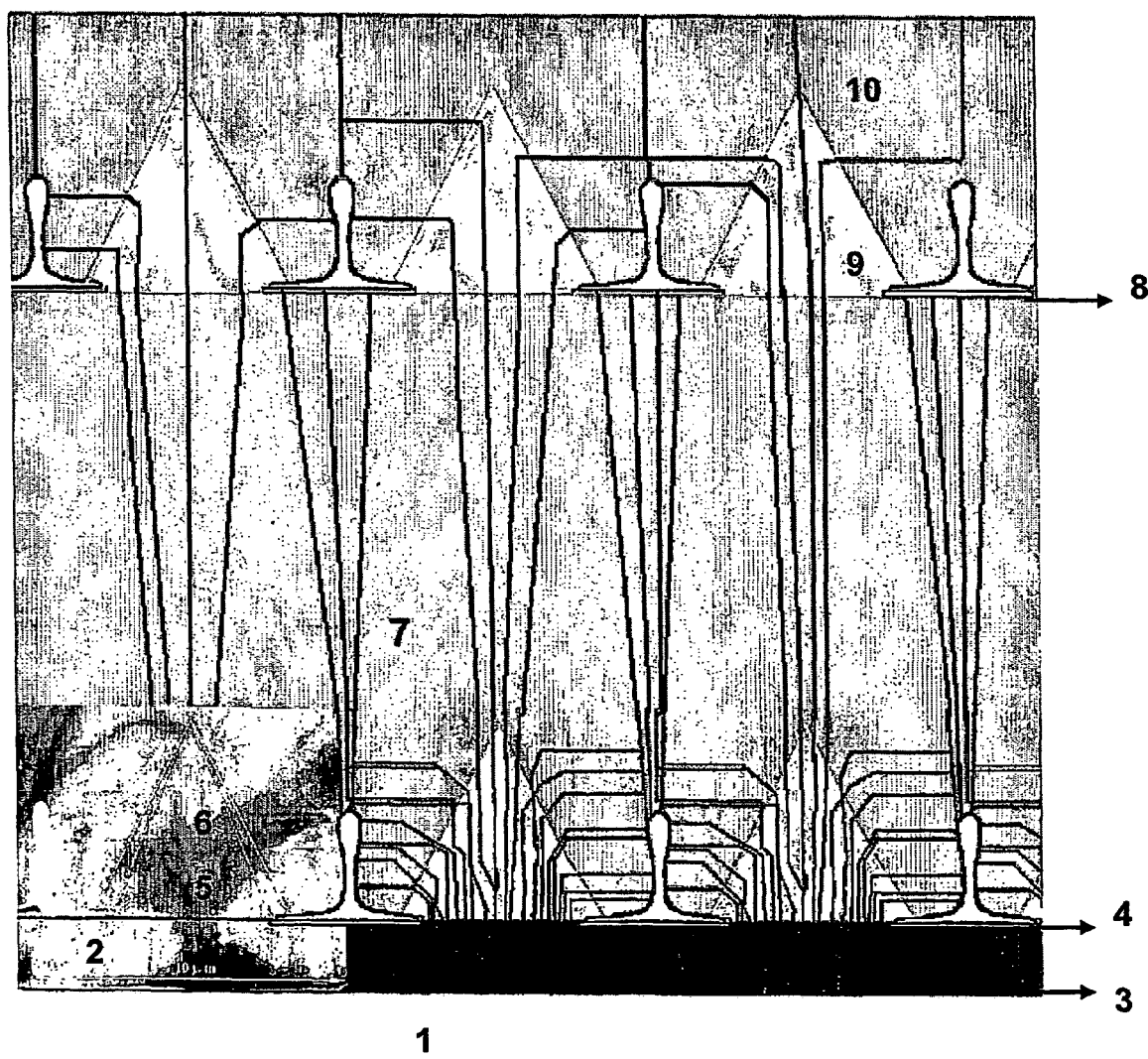

FIG. 5 is another illustration of the present invention where the second mask is placed after several μm of GaN growth. It this case TDs at the coalescence boundaries start to diverge, therefore the second mask is efficient in stopping TDs from the coalescence boundaries and bending TDs from the apex of the first ELO.

Figure 6:
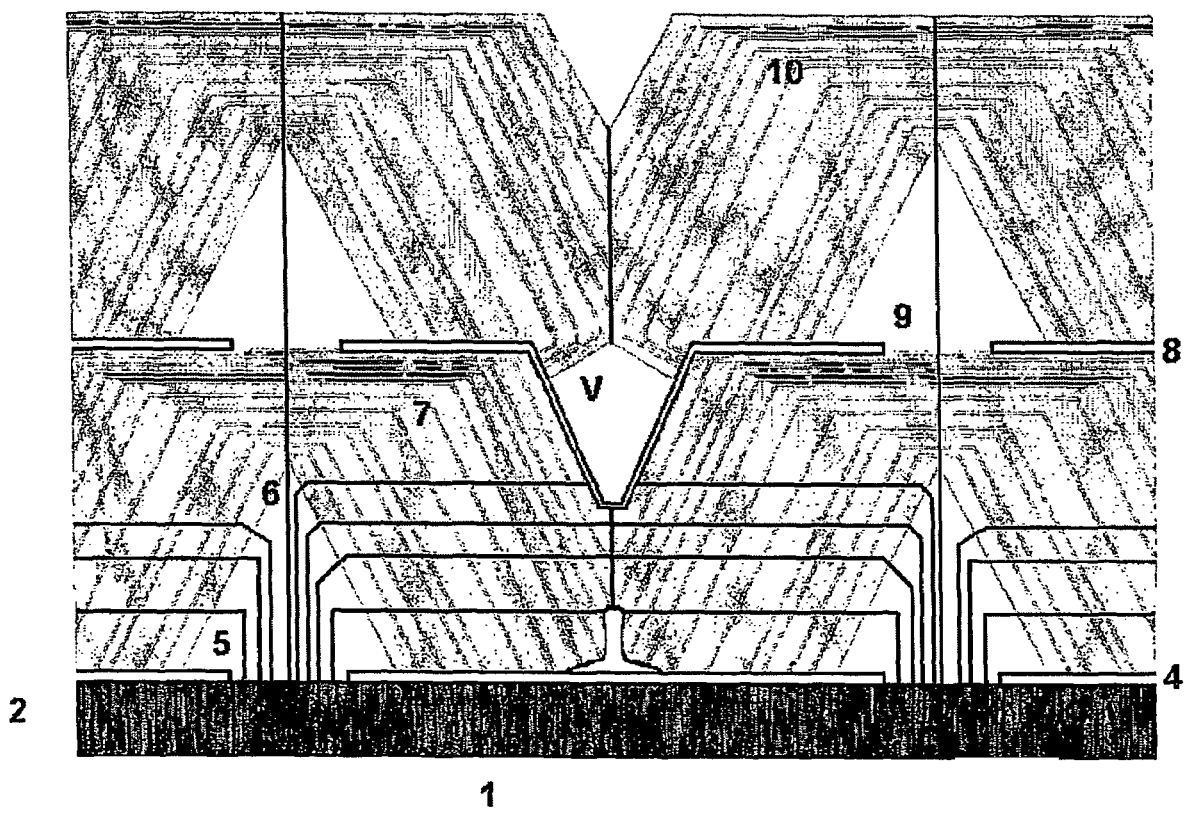

FIG. 6: In this modification of the method, the second mask is deposited before full coalescence of the first ELO thereby generating voids of controllable shape (voids engineering)

Figure 7:
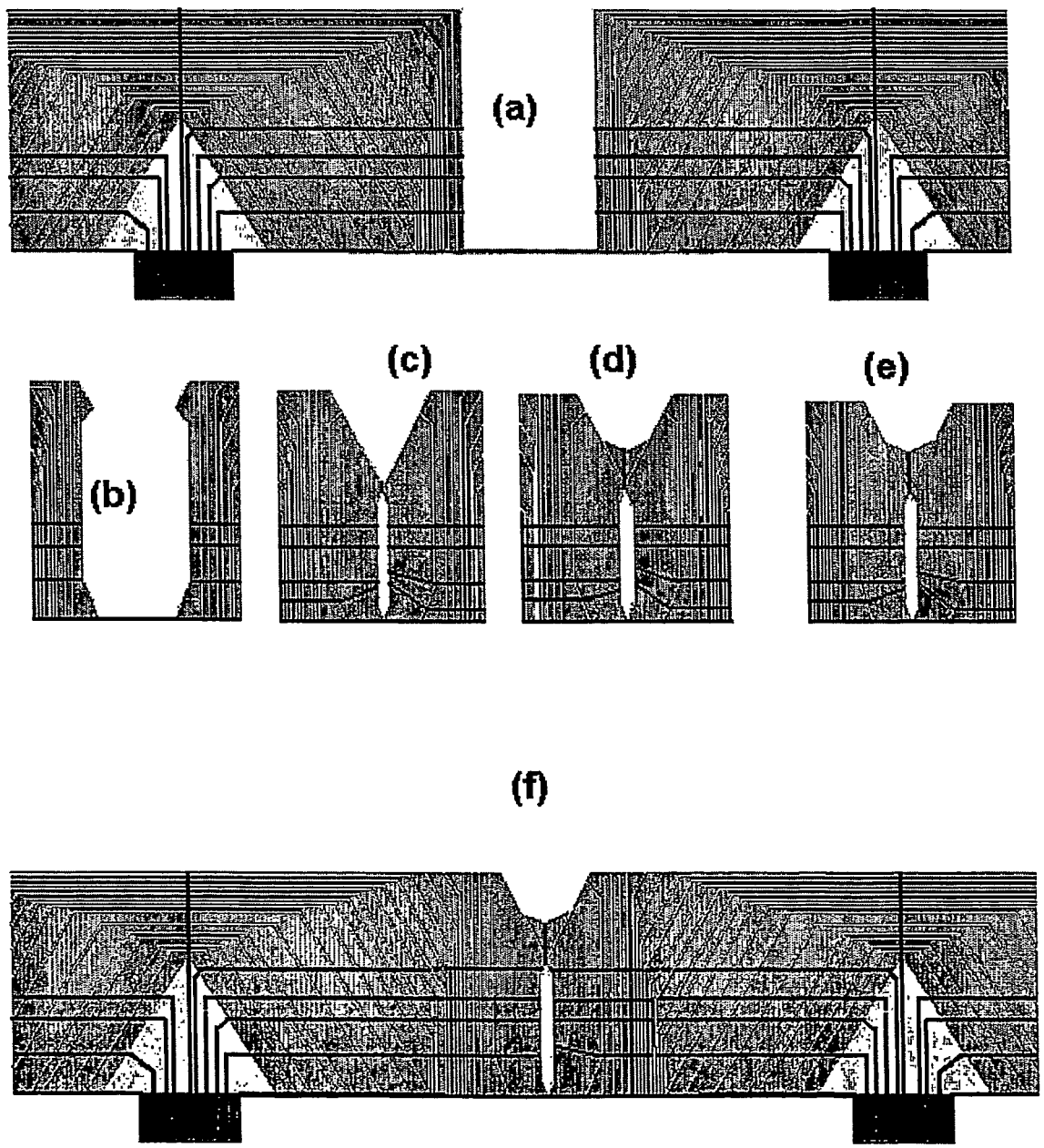

FIG. 7 shows the evolution of an ELO where a trench has been grooved under mass transport to produce a void of appropriate height.

Figure 8:
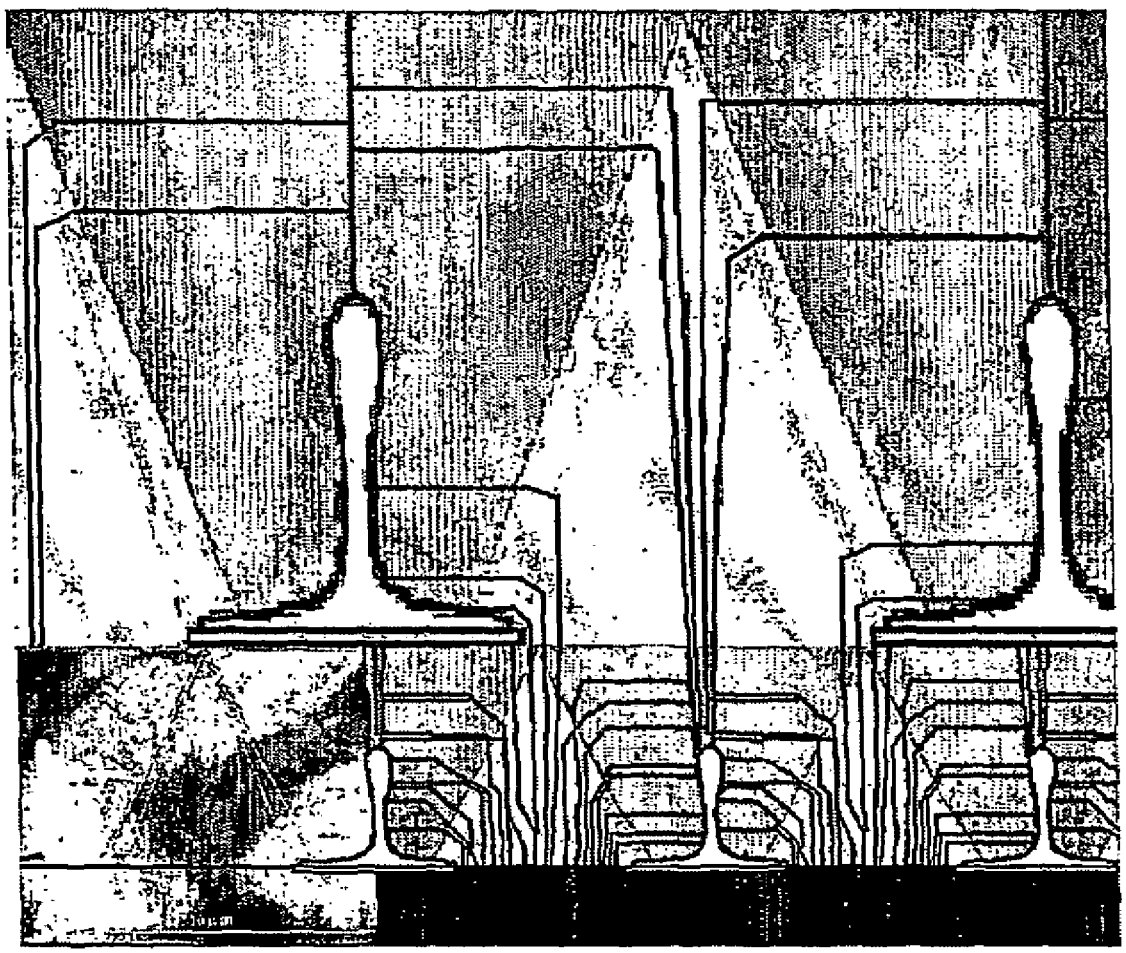

FIG. 8, schematically shows an example where the pitch of the second mask is exactly twice the first one. This allows wider defect free stripes.

Figure 9:
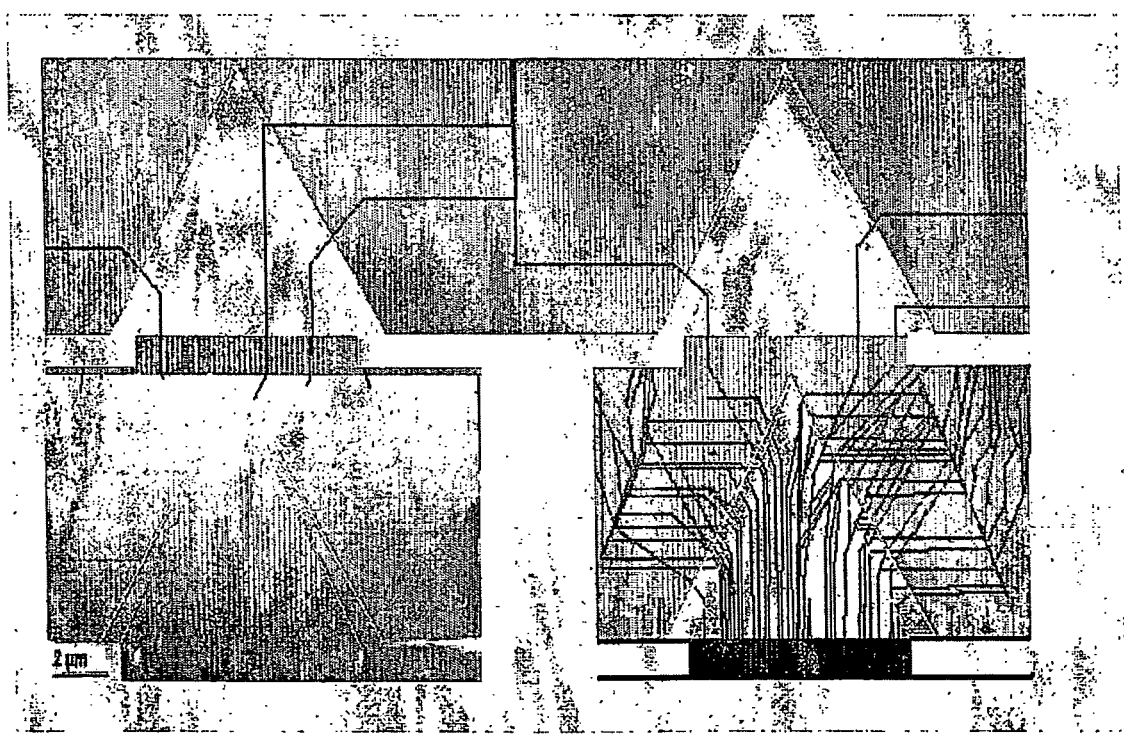

FIG. 9. The growth is carried out by HVPE, grown is achieved on a mask pattern exactly in registry with the first mask set. The second regrowth is also a two-step process. The lowest left part corresponds to a TEM image of GaN grown according the two-step-ELO (V. Wagner et al, APL (2002). In this example the openings are 5 μm wide and the pitch 13 μm, defects appear before coalescence due to strain or impurities.

Figure 10:
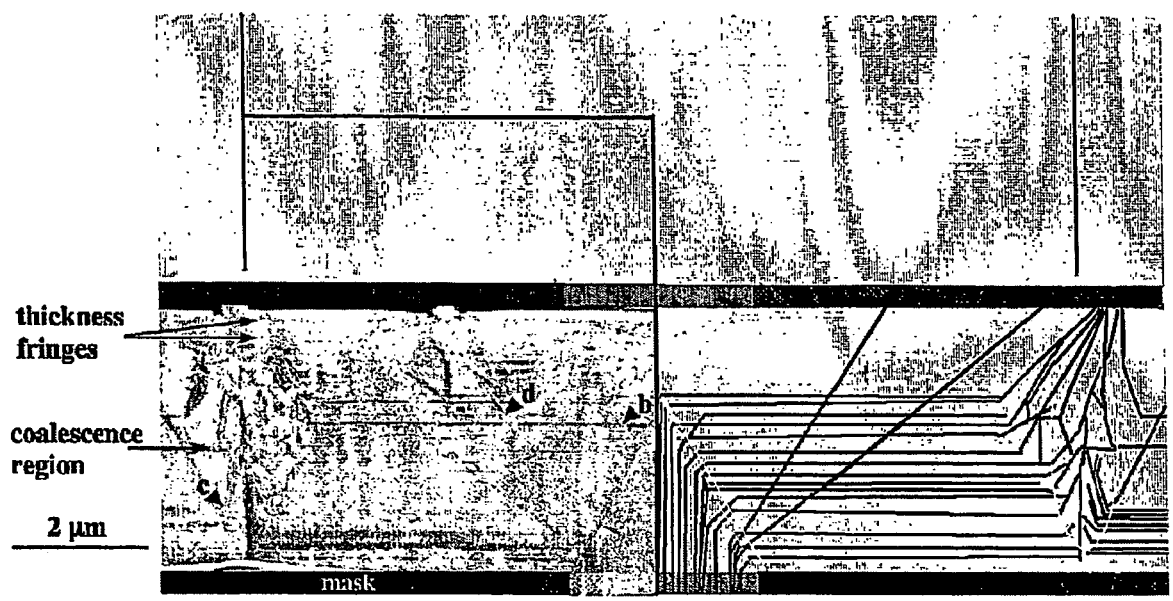

FIG. 10 is another example of growth by HVPE according to this invention where the openings are 5 μm and the pitch 15 μm. TDs propagate laterally without generating new defects, but in the coalescence boundaries, a bundle of dislocations is formed, which are eliminated by the second mask.

Figure 11:
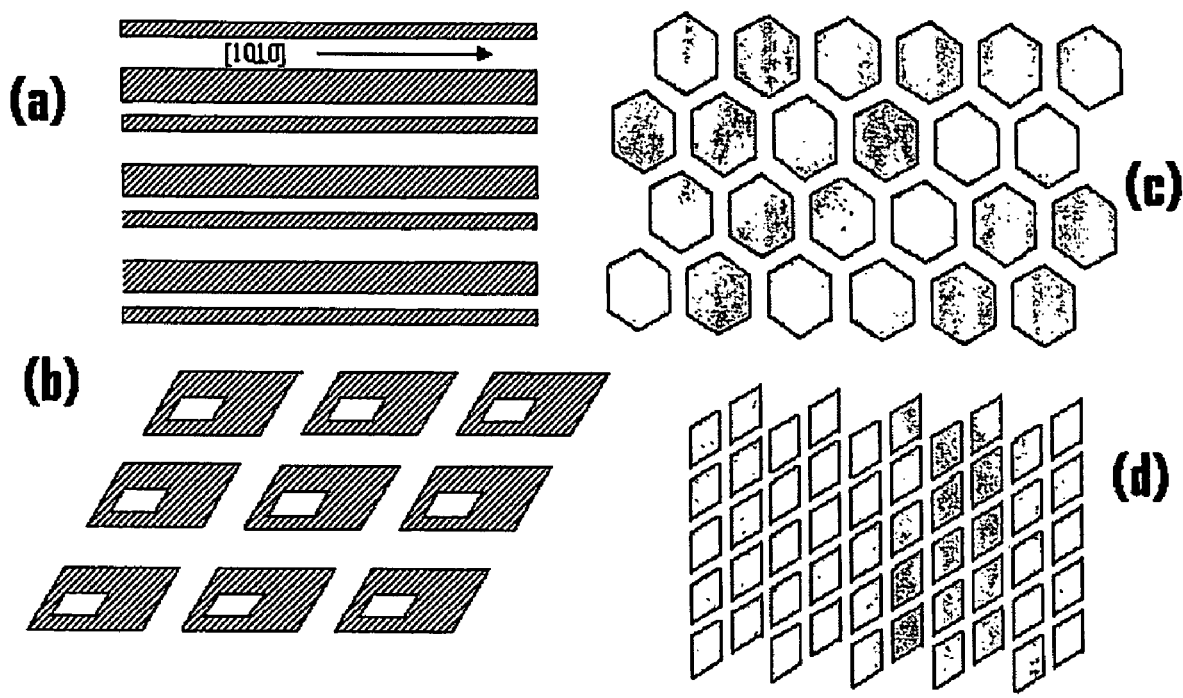

FIG. 11 gathers some of the possible patterns for the openings according to the present invention.

4. DETAILED DESCRIPTION OF THE INVENTION

The present invention concerns a process for producing an epitaxial layer of gallium nitride (GaN) comprising:
- the deposition of a GaN layer on a substrate,
- the deposition of a first mask with a plurality of first openings forming patterns,
- a first regrowth of a gallium nitride layer on the said mask under epitaxial conditions,
- a second regrowth of gallium nitride, with a doping agent as an enhancer of lateral growth with respect to the vertical growth so as to induce the deposition of gallium nitride features and anisotropic and lateral growth of said features,
- the deposition of a second mask with a plurality of second openings forming the same patterns as the first openings exactly above the first ones, providing that the pitch of the pattern of the first openings is exactly identical or twice the pitch of the second openings,
- a third regrowth of a gallium nitride layer on the second mask under epitaxial conditions,
- a fourth regrowth of gallium nitride, with a doping agent as an enhancer of lateral growth with respect to the vertical growth so as to induce the deposition of gallium nitride features and anisotropic and lateral growth of said features.

The temperature may be raised during the second and fourth regrowth to enhance the lateral growth. The enhancement of the lateral growth during the second and fourth regrowth may also be carried out by raising the ratio of the partial pressure of ammonia over the gallium source or by lowering the pressure during the second and fourth regrowth.

The openings may be of different types and for example stripes, or punctual openings which may be chosen among polygons and especially hexagons, triangles or a combination of such openings. Each of the plurality of opening patterns can take form in pattern elements arranged in one direction in a plane almost parallel to the surface of the substrate. Advantageously, the periodic pattern is along the [10-10] direction.

The pitch or in other words the period of the pattern can be mono- or two-dimensional. Examples of various possible patterns suitable for the present invention are gathered in FIG. 11 (see example 7).

The pitch of pattern elements of one of the plurality of patterns and the pitch of pattern elements of another of the plurality of patterns can be different from each other, but in this particular case, said plurality of patterns remain parallel to each other.

When the openings are in the form of stripes, they generally have a width of less than 10 μm.

The exposed proportion (or total opening area) of substrate or of gallium nitride with respect to the total area of the substrate is between 5 and 80%, advantageously 5 and 50%.

The dielectric layer is preferably a layer of the SixNy type, especially $Si_3N_4$. $SiO_2$ may also be used, but other well-known dielectrics could also be used.

The doping agent as used in the second and the fourth regrowth according to the process of the present invention is chosen among magnesium, antimony or bismuth.

The second and the fourth regrowth of the process according to the present invention are carried out by Metal Organic Vapour Phase Epitaxy (MOVPE), or Halide Vapour Phase Epitaxy (HVPE), Close Space Vapour Transport (CSVT) or a combination of two of the above mentioned growing methods.

The GaN top layer 10 could be either non-intentionally doped, or n-type or p-type. N- and P-type doping is achieved by an appropriate introduction of a doping impurity in the vapour phase, such as Silicon or oxygen for n doping or Mg for p doping.

According to another advantageous variant, the succession of steps according to the process subject of the present invention may be repeated more than one time, to further reduce the TDs density.

The invention also relates to the epitaxial gallium nitride layers which can be obtained by the processes encompassed within the scope of the present invention. Advantageously said epitaxial gallium nitride layers have a thickness between 1 μm and 1000 μm and are optionally separated from their substrate.

The invention further relates to a GaN free standing crystal separated from the substrate which can be obtained by the processes encompassed within the scope of the present invention characterized in that it has a thickness between 10 and 1000 μm but also to a thick free standing GaN obtained by thickening, by HVPE or CSVT a GaN epitaxial layer obtained by the process according to the present invention.

The present invention also relates to optoelectronic components, especially laser diodes, characterized in that they are fabricated with an epitaxial layer of gallium nitride as described above.

Preferred embodiments of the present invention will be explained with reference to the drawings.

Figure 3:
FIG. 3 is a schematic cross-sectional view of GaN grown by the two-step-ELO (2S-ELO) process as a starting layer in the present invention.

The method of manufacturing such substrates comprises several steps as schematically shown on FIG. 3 and FIG. 4:

[1] Epitaxial growth is carried out using preferably by Metal Organic Vapour Phase Epitaxy (MOVPE), even though Halide Vapour Phase Epitaxy (HVPE) and close space Vapour Phase transport (CSVT, also refereed as sublimation) can also be used.

[2] The substrate 1 generally has a thickness of a few hundred μm (in particular approximately 300 μm) and may be chosen from the group consisting of sapphire, ZnO, 6H—SiC, 4H—SiC, 3C—SiC, Si, $LiGaO_2$, $LiAlO_2$, $MgAl_2O_4$, $ZrB_2$, GaAs, $HfB_2$, AlN, GaN, $MgAl_2O_4$ and advantageously is sapphire (0001).

[3] Preferably, the carrier gas is a $N_2/H_2$ mixture.

[4] The following paragraphs [4] to [10] are directed to a preferred process to produce the GaN layer 3. This process for producing a layer of gallium nitride (GaN) 3 is characterized in that it comprises the deposition on a substrate 1 of a silicon nitride layer 2 functioning as a nanomask and the growth of GaN on the masked substrate under epitaxial deposition conditions so as to induce the deposition of gallium nitride features and the anisotropic growth being continued until coalescence of the various features. The term "islands" or "features" may also be employed.

[5] After nanomasking by SiN, the gallium nitride deposition is generally carried out in two steps.

[6] In a first step, at a temperature of approximately 600° C., a buffer layer of GaN is deposited, from which the GaN islands will emerge, then at a higher temperature (approximately 1000-1100° C.) for the growth of an epitaxial layer from said islands.

Figure 1:
FIG. 1 shows the island formation resulting from the deposition of silicon nitride on the bare substrate, the deposition of a low temperature GaN buffer layer, and the annealing of this buffer layer at the final growth temperature (a); the as grown layer before fill coalescence, growth has occurred by lateral extension along [10-10] directions (b)
Figure 1:
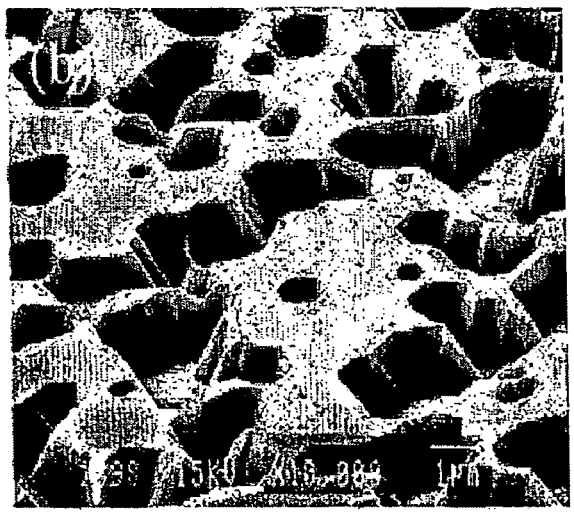
Figure 2:
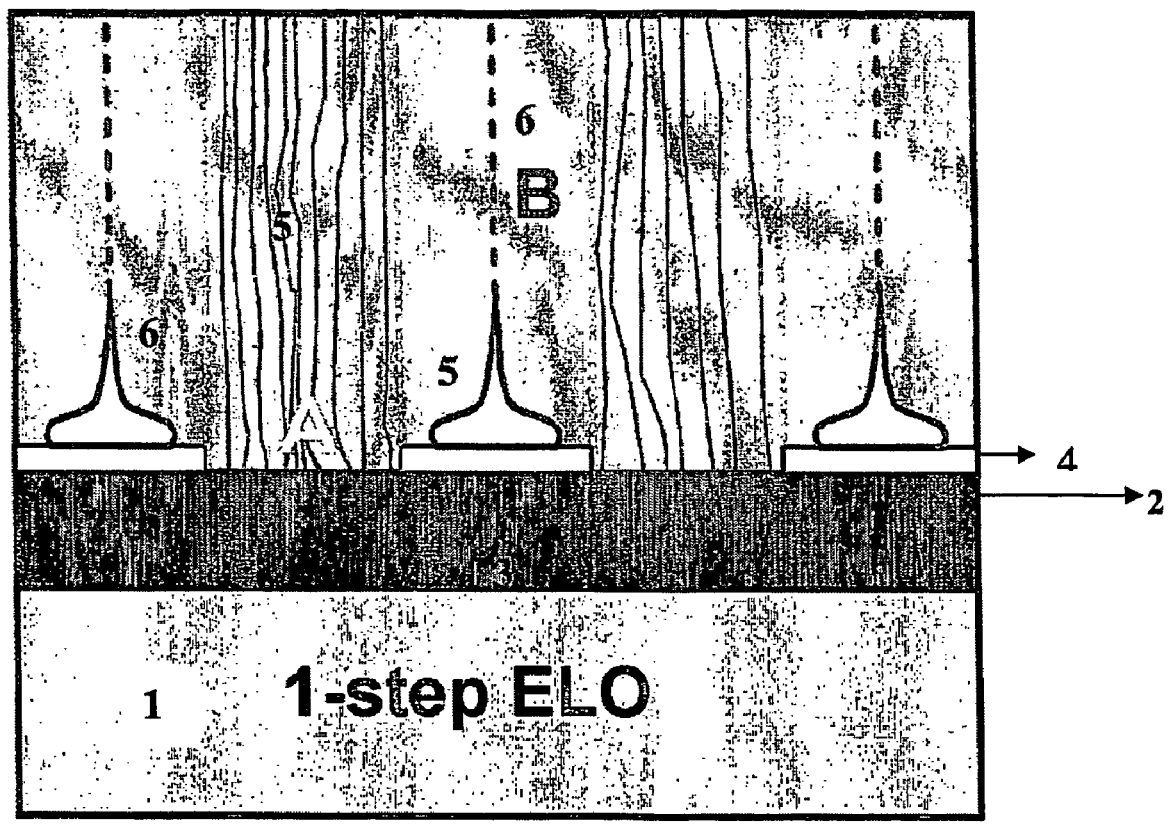
FIG. 2 is a schematic cross-sectional view perpendicular to the [1-100] direction of GaN grown by the standard one-step-ELO (1S-ELO) as described in numerous papers.

[7] During the temperature ramping from the deposition of the nucleation layer at ~600° C. up to the final growth temperature, then regular islands develop (FIG. 1(a)).

[8] Then, the GaN growth, which takes place laterally from these islands in the [10-10] directions on the SiN covered surface, proceeds until full coalescence. FIG. 1(b) shows the surface just before coalescence. This process leads to much better GaN crystal quality than the usual processes. After said features have been obtained, the growth may be continued either using MOVPE or HVPE.

[9] Examination on high resolution microscope shows that the dislocation density in the regular features or islands, which has therefore grown without heteroepitaxial strains, is very much less than that existing in the first layer.

[10] The following paragraphs [10] to [17] are directed to a particular embodiment which is well illustrated in example 1. According to said embodiment, a silicon nitride layer 4 is deposited on this GaN epitaxial layer 3 in situ in the growth chamber by the simultaneous supply of silane and ammonia. This layer is hereafter etched, so as to define apertures 5 (or openings 5) and to expose the facing regions of the substrate.

[11] The mask layer is patterned using photolithography and etching of the dielectric is carried out by reactive ion etching (RIE). Apertures 5 in the form of stripes are defined in the silicon nitride mask, thus exposing gallium nitride surface on a micrometric feature. The apertures can preferably be regular polygons. Advantageously, the apertures in the form of stripes have a width of less than 10 µm, the length of the stripe being limited by the size of the substrate. Spacing of the apertures is regular and must allow localized gallium nitride epitaxy followed by anisotropic and lateral growth. In general the portion of the exposed area (or total opening area) of substrate is between 5 and 80%, preferably between 5 and 50%. It has been found that gallium nitride is not deposited on the silicon nitride mask.

[12] The first mask layer 4 and the second mask layer 8 have about 2-10 nm thickness and are constituted of silicon nitride deposited in the growth chamber. Each of the masks has a plurality of openings extending in the GaN [1-100] direction (perpendicular of the drawing of FIG. 5). In each of the first mask layer 4 and the second mask 8, a width for the mask area is for instance 2-5 µm and a pitch for example 5-15 µm. The mask and the pitch are identical between the first and the second mask respectively.

[13] GaN is regrown under epitaxial deposition conditions on the masked and etched substrate so as to induce the deposition of GaN 6 on the facing regions and the anisotropic and lateral growth of said features, the lateral growth being continued until formation of triangular stripes with {11-22} lateral facets (first step of the ELO).

[14] Subsequently, gallium nitride continues to be deposited in the presence of a dopant chosen among magnesium, antimony or bismuth (i.e. Mg, Sb, Bi) (and/or at higher temperature, and/or at lower operating pressure, and/or at higher ammonia over TMG partial pressures ratio) in order to favour the lateral growth resulting in the full coalescence of the features 7. (second step of the ELO)

[15] Advantageously, these layers have a TDs density in the mid $10^7$ cm$^{-2}$ measured on the whole surface, $<10^7$ cm$^{-2}$ between the stripes.

[16] Subsequently, on the layer 7, a second mask 8 is deposited in which a plurality of openings 9 is disposed exactly on top of the first one 4 (FIG. 4). Indeed they are arranged in such a way that TDs arising from coalescence boundaries of the first layer 7 are prevented from propagating in the growing layer. Compared to other technologies U.S. Pat. No. 6,051,849 Davis et al, 1999, WO 99/44224, Davis et al, 1999, U.S. Pat. No. 6,111,277, Ikeda, 2000, U.S. Pat. No. 6,015,979, Sugiara et al, (2000), US2001/0003019A1 where the second mask must be shifted with respect to the first one, in order to interrupt the threading dislocations (above the openings) from propagating in the upper layer, in the present invention the two mask must be exactly in registry to obtain advantage of the TDs reduction mechanisms. The 2S-ELO technology (U.S. Pat. No. 6,325,850) prevents the occurrence of TDs above the openings.

[17] According to another advantageous embodiment, the second epitaxial regrowth is carried out in two steps as described in [13]-[14].

[18] This lowers the density of TDs in the selective growing layer at the uppermost layer (second selective growing layer 10 in this embodiment) to about $10^7$ cm$^{-2}$.

[19] A substrate according to the present invention is a combination of the substrate 1, the intermediate fully coalesced 2S-ELO and the fully coalesced 2S-ELO 10. The devices are fabricated on the top surface of 10, by homoepitaxy.

[20] According to a further embodiment, the second regrowth of gallium nitride is not continued until coalescence of the various features so as to form voids into the obtained epitaxial layer of gallium nitride. This embodiment is described in more details in example 2 and 3. This particular process encompassed within the scope of the present invention can lead to spontaneous separation of the upper part of the obtained epitaxial layer of gallium nitride thanks to the presence of voids.

EXAMPLE 1

A Suitable Epitaxial Growth Reactor is Used for the Metal Organic Vapour Phase Epitaxy.

[1] Explicitly, a substrate 1, especially (0001) sapphire is used. A very thin film of silicon nitride 2 is formed on the surface of the sapphire, the film being obtained by reaction between $NH_3$ and silane $SiH_4$ for a time short enough to limit the thickness of the film to that of about a few atomic planes.

The operating conditions are the following:

[2] The gaseous vehicle is a mixture of nitrogen and hydrogen in equal proportions. The ammonia is introduced together with the silane, in a form diluted to 50 ppm in hydrogen. Under these conditions, the typical $NH_3$ and $SiH_4$ reaction time is of the order of 30 seconds.

The successive steps are monitored by laser reflectometry (LR). After the dielectric layer has been completely formed, a continuous gallium nitride layer having a thickness of 20 to 30 nm is deposited on the dielectric film. The deposition of the GaN layer is made at a low temperature, of the order of 600° C. After the deposition of the GaN layer has been completed, it is annealed at a high temperature of the order of 1080° C. Under the combined effect of the temperature rise, of the presence in the gaseous vehicle of a sufficient amount of hydrogen and of the presence of the very thin dielectric film beneath the GaN layer and also the antisurfactant effect of silicon, the morphology of said GaN layer undergoes deep modification resulting from solid-phase recrystallization by mass transport. When the temperature approaches 1060° C., the reflectivity of the buffer layer suddenly decreases. The initially continuous buffer layer is then converted into a discontinuous layer formed from gallium nitride pyramids (FIG. 1(a)). At the end of this spontaneous in situ recrystallization process, GaN features or islands of very good crystal quality are obtained, these retaining an epitaxial relationship with the substrate by virtue of the very small thickness of the dielectric layer. During the subsequent epitaxial regrowth with gallium nitride, the GaN features or islands will develop by lateral and vertical growth. GaN layers 3 have thus been obtained by full coalescence of the GaN features having a defect density of the order of $10^8$ cm$^{-2}$.

[3] A SiN mask 4 is then deposited on such a GaN layer. Linear apertures 3 μm in width and spaced apart by 7 μm are then made in the mask in order to expose the regions of the subjacent layer. The linear apertures 5 are advantageously oriented in the GaN [1-100] direction, although the variant of the process described in this example can be optionally carried out for other orientations of the linear apertures, especially in the GaN [11-20] direction.

[4] The epitaxial regrowth is carried out on the exposed regions 6 with unintentionally doped GaN under operating conditions such that the growth rate in the [0001] direction of the GaN features sufficiently exceeds the growth rate in the direction normal to the inclined flanks of said features. Under such conditions, the anisotropy of the growth results in the disappearance of the (0001) facet. The first implementation step of the process is completed when the (0001) facet of the GaN feature has disappeared. At the end of the first step, the GaN features are in the form of a stripe with {11-22} lateral facets, the cross section of which is triangular. However, it is possible to continue the first step until coalescence of the GaN features, in order to completely cover the mask.

[5] The second step consists of the epitaxial regrowth with doped GaN, especially with magnesium-doped GaN on the GaN features created in the first step. Due to the effect of introducing the dopant, the growth anisotropy is conducive to planarization of the GaN features. The facet (0001) reappears at the top of each of the GaN features obtained in the first step. During this second step, the doped GaN features develop with an expansion of the facet (0001) and, on the contrary, a reduction in the area of the flanks. The same effect can be obtained by increasing the temperature up to 1150° C. or decreasing the operating pressure, or increasing the V/III ratio in the vapour phase. The second step of the process according to the example is completed when the flanks have disappeared, the upper surface of the deposit formed by the coalesced doped-GaN features then being flat.

[6] Because of the bending at 90° of the TDs, the upper surface formed by the coalescence of the GaN features is virtually free of emerging defects in regions compatible with the size of electronic devices, such as GaN diode lasers. Remaining TDs appear on the coalescence boundaries and possibly from the middle of the opening where TDS do not reach lateral facets.

[7] To further improve the crystallographic quality of this GaN, the 2S-ELO is repeated with another deposition of SiN 8, masking, with openings 9 exactly above the first one's, so that the coalescence boundaries areas are masked (FIG. 4). The remaining TDs are either stopped by the mask 8 or experience a 90° bending.

[8] Such a process produces GaN with TDs <$10^7$ cm$^{-2}$.

EXAMPLE 2

Shorter or Longer First ELO Process: Void Engineering.

[1] The example 1 describes a double 2S-ELO GaN in which the two 2S-ELO have basically the same duration. In other modifications of the process the first 2S-ELO could be longer (FIG. 5), in such a way that remaining TDs from the first 2S-ELO starting to be redistributed will be either bent at 90° or stopped by the mask.

[2] Conversely, the second 2S-ELO can start even before full coalescence, (FIG. 6). In this later modification a void V can be created, and the shape of the void can be tuned from the growing conditions. In FIG. 6, the mask 8 covers partially the (0001) plane and completely the V-Shaped facets. This second alternative of the process described in the example 1 indeed allows controlling the shapes and distributions of voids. Henceforth, this void engineering can be adjusted to favour spontaneous strain induced separation of the upper part 10 from the substrate 1.

[3] Such a process produces GaN with TDs <$10^7$ cm$^{-2}$.

EXAMPLE 3

Void Engineering by Mass Transport

[1] In the 2S-ELO technology, TDs after bending at 90° are propagating parallel to the substrate surface towards the coalescence boundaries. Actually the two laterally overgrowing wings pinch off together to form a coalescence boundary. Eventually a void V is formed at this coalescence boundary (most likely due to reduced supply of active species). Interestingly, three behaviours of TDs are observed. Since TDs must terminate on a free surface, they are observed to end up in the void (TD type 1), bend downwards and end up on the top of the void, TDs type 2, and finally, they could bend one again upwards towards the top of the layer and merge creating a depression, TDs 3. These types 3 TDs are deleterious to the final quality of the layer since they can not be eliminated and they propagate into the device grown on top of the layer. Besides, it has been shown that the shape of the void control the residual stress in ELO layers. [M. Benyoucef, et al, Appl. Phys. Lett. 79, 4127-9 (2001)].

[2] It would be of great interest to control the shape of the voids in such a way that all TDs propagating laterally end up in the voids. It would be also of great interest to adjust the shape of the voids either to reduce the stresses or conversely, to induce shear stress at the openings to enhance the strain induced separation.

[3] It is well established that the shape of the overgrowing stripes is tuned by the growth conditions, pressure, temperature, V/III ratio. However, it is difficult to shape the void only by controlling the growth conditions. The degree of freedom is very narrow.

Under controlled growth conditions, the lateral facets in the second step of the 2S-ELO are tuned to be {11-20} (FIG. 7(a)). In these two laterally growing vertical fronts, TDs are perpendicular to the free surface and propagate without bending. The progression of the two vertical facets is stopped to create a trench with a width of a couple of μm. (FIG. 7(a)). This distance can be exactly adjusted. Then, as initially proposed by Detchprohm et al, Jpn. J. Appl. Phys., 40, L16(2001) to bend dislocations, mass transport will be used in the present approach to create a void with a well defined geometry. FIG. 7(b) to (e). Mass transport occurs at high temperature, about 1100° C., under ammonia, of course without supply of TMG. Mass transport occurs via surface diffusion. Like in all GaN related growth processes anisotropy produces facets. At the end of the mass transport step, a vertical void is created. Provided the height of the void is at least equal to the height of the triangular stripe obtained in the first step, all TDs propagating laterally will end up in this void. Only one well defined coalescence plane will be formed.

[4] The final surface as shown FIG. 7(f) only exhibit depressions above the voids that can be easily removed by growth under enhancement of the lateral growth (high temperature or Mg doping).

[5] Finally experiment ends up by regrowth with enhanced lateral rate to get a flat surface. The process is repeated a second time to further reduce the TDs density and to enhance the brittleness of the top layer 10 to induce easy separation from the substrate 1.

[6] Such a process produces GaN with TDs <$10^7$ cm$^{-2}$.

EXAMPLE 4

Double Period

[1] In another embodiment of the invention, the second 2S-ELO is achieved with a pitch that is twice the one used in the first 2S-ELO (FIG. 8). The first 2S-ELO can be made with pitch smaller than usual using patterning technologies like focused ions beam (FIB). Typically pitches or the order of 1 μm are achievable. Two advantages result from this technology. Since the first ELO requires a very thin layer of the order of a couple μm, the bowing of the first ELO wafer remains weak, thereby making the alignment of the second mask more accurate. Besides, since in this technology, the only remaining TDs are those coming from the coalescence boundaries, this modification of the invention allows to get wider completely defect free stripes larger than 10 μm for the LDs technology.

[2] Such a process produces GaN with IDs <$10^7$ cm$^{-2}$.

EXAMPLE 5

HVPE

[1] The 2S-ELO technology has been proven to be achievable by HVPE (see for instance V. Wagner et al, JAP, 92, 1307, 2002). However the enhancement of the lateral growth in HVPE is achieved by changing the composition of the carrier gas. Compared to MOVPE, HVPE allows greater growth rate. Therefore the pitch can be much higher than in MOVPE, for instance 5 μm openings separated by 50 μm wide masked stripes. In the example 3, the starting layer is a 2 μm thick MOVPE layer following the process described in example 1.

[2] The mask is made using also the same basic technology (SiN in situ deposited mask, or SiO$_2$ ex situ, photolithography and RIE). The pitch of the patterning is either 15 μm or 55 μm, with 5 μm openings and 10 or 50 μm wide masked areas.

[3] During the first step of the ELO, a mixture of hydrogen and nitrogen is used as carrier gas. Then triangular stripes are formed like in example 1.

[4] Afterwards, growth continues solely by lateral extension of the {11-22} facets until the growth fronts from two adjacent stripes meet.

[5] Further growth proceeds until full coalescence. At this stage, the carrier gas composition is switched to pure nitrogen to get a flat surface. The left bottom of FIGS. 9 and 10 schematically shows the repartition of TDs at the end of this first ELO (The Figure are built from TEM data). As expected, TDs are located in the coalescence region. In addition, on FIG. 9, a V-shaped complex of dislocation loops occurs (which does not appear in MOVPE). Therefore, the second masking stops the propagation of these defects.

[6] In FIG. 10, where the pitch is large, numerous TDs are generated in the coalescence boundary. Once again the second masking prevents the propagation of these defects in the second 2S-ELO.

EXAMPLE 6

HVPE Coupled with MOVPE

[1] Since HVPE allows much higher growth rate than MOVPE, an adequate coupling led to shorter time for the coalescence of stripes with much wider separation.

[2] Actually the experience could be carried out following different ways: the growth is done by MOVPE following the example 1 until the formation of the second set of triangular stripes.

[3] Then the growth further proceeds by HVPE until first full coalescence, then until a significant thickness is reached (~200-300 μm) to allow the separation of the substrate 1 and to get free standing GaN.

[4] The separation of the substrate 1 can be made using either laser lift off or grinding of the substrate. Advantageously, the strain induced separation during cooling can be monitored by an appropriate voids engineering.

[5] This thereby produces free standing GaN with TDs densities <$5 \times 10^6$ cm$^{-2}$.

EXAMPLE 7

Different Opening Shapes

In the previous examples, the mask patterns were defined as stripe openings along a given crystallographic direction with a given pitch. The present invention is not restricted to such patterns. Two dimensional arrays of punctual openings can be used (FIG. 11 (b), (c), (d) provided that the two patterning 4 and 8 lie exactly on top of each other and that growth of the GaN layers proceeds following the 2S-ELO process. Also non-symmetrical arrays of either stripe openings or punctual openings as shown in FIG. 11 (a) and (b) can be used as masks 2 and 4.

FIG. 11 (a) to (d) shows different possible shapes of the openings, these are given as examples, the shapes of masks for ELO technologies are not restricted to FIG. 11.

REFERENCES CITED

WO 99/20816, U.S. Pat. No. 6,325,850, US2002015952
U.S. Pat. No. 6,051,849 Davis et al, 1999; US20020148534
WO 99/44224, Davis et al, 1999
U.S. Pat. No. 6,111,277, Ikeda, 2000
U.S. Pat. No. 6,015,979, Sugiara et al, (2000)
US2001/0003019, E. Morita et al, (2001)

PUBLISHED PAPERS

Epitaxial Lateral Overgrowth of GaN B. Beaumont, Ph. Vennéguès, P. Gibart, physica status solidi (b), 1-43 (2001)

Structural and optical properties of lateral overgrown GaN grown by double Pendeo-Epitaxy technique
   H. S. Cheong, C. S. Park, C.-H. Hong, J. H. Yi, S. J. Leem and H. K Cho, O.-H. Nam, physica status solidi (c), 0, N°1, 550-553(2002)

What is claimed is:

1. A process for producing an epitaxial layer of gallium nitride (GaN) comprising:
   depositing a GaN layer on a substrate;

depositing a first mask with a plurality of fast openings forming patterns;

forming a first regrowth of a gallium nitride layer on the said mask under epitaxial conditions;

forming a second regrowth of gallium nitride, with a doping agent as an enhancer of lateral growth with respect to the vertical growth so as to induce the deposition of gallium nitride features and anisotropic and lateral growth of said features;

depositing a second mask with a plurality of second openings forming the same patterns as the first openings exactly above the first ones, providing that the pitch of the pattern of the fast openings is exactly identical or twice the pitch of the second openings;

forming a third regrowth of a gallium nitride layer on the second mask under epitaxial conditions;

forming a fourth regrowth of gallium nitride, with a doping agent as an enhancer of lateral growth with respect to the vertical growth so as to induce the deposition of gallium nitride features and anisotropic and lateral growth of said features.

2. The process for producing an epitaxial layer of gallium nitride (GaN) according to claim 1, wherein the temperature is raised during the second and fourth regrowth to enhance the lateral growth.

3. The process for producing an epitaxial layer of gallium nitride (GaN) according to claim 1, wherein the ratio of the partial pressure of ammonia over the gallium source is raised during the second and fourth regrowth to enhance the lateral growth.

4. The process for producing an epitaxial layer of gallium nitride (GaN) according to claim 1, wherein the pressure is lowered during the second and fourth regrowth to enhance the lateral growth.

5. The process for producing an epitaxial layer of gallium nitride (GaN) according to claim 1, wherein each of the plurality of opening patterns takes form in pattern elements arranged in one direction in a plane almost parallel to the surface of the substrate.

6. The process for producing an epitaxial layer of gallium nitride (GaN) according to claim 5, wherein the pitch of pattern elements of one of the plurality of patterns and the pitch of pattern elements of another of the plurality of patterns are different from each other, but said plurality of patterns remain parallel to each other.

7. The process for producing an epitaxial layer of gallium nitride (GaN) according to claim 1, wherein the pattern elements of each of the plurality of patterns are in the form of stripes.

8. The process for producing an epitaxial layer of gallium nitride (GaN) according to claim to claim 7, wherein the stripes have a width of less than 10 μm.

9. The process for producing an epitaxial layer of gallium nitride (GaN) according to claim 1, wherein the openings are punctual openings.

10. The process for producing an epitaxial layer of gallium nitride (GaN) according to claim 1, wherein the openings are regular polygons.

11. The process for producing an epitaxial layer of gallium nitride (GaN) according to claim 1, wherein the exposed proportion of substrate or of gallium nitride with respect to the total area of the substrate is between 5 and 80%.

12. The process for producing an epitaxial layer of gallium nitride (GaN) according to claim 1, wherein said second regrowth of gallium nitride is discontinued until coalescence of the various features so as to form voids into the obtained epitaxial layer of gallium nitride.

13. The process for producing an epitaxial layer of gallium nitride (GaN) according to claim 12, further comprising a step of spontaneous separation of the upper part of the obtained epitaxial layer of gallium nitride due to the presence of voids.

14. The process for producing an epitaxial layer of gallium nitride (GaN) according to claim 1, wherein the substrate is chosen from the group consisting of sapphire, ZnO, 6H—SiC, 4H—SiC, 3C—SiC, Si, $LiGaO_2$, $LiAlO_2$, $ZrB_2$, $HfB_2$, GaAs, AlN, GaN and $MgAl_2O_4$.

15. The process for producing an epitaxial layer of gallium nitride (GaN) according to claim 1, wherein the dielectric layer is a layer of the $Si_xN_y$ type.

16. The process for producing an epitaxial layer of gallium nitride (GaN) according to claim 1, wherein said doping agent as used in the second and the fourth regrowth is selected from magnesium, antimony or bismuth.

17. The process for producing an epitaxial layer of gallium nitride (GaN) according to claim 1, wherein the vapour phase epitaxial deposition conditions involve the use of a carrier gas.

18. The process for producing an epitaxial layer of gallium nitride (GaN) according to claim 1, wherein said second and the fourth regrowth are carried out by Metal Organic Vapour Phase Epitaxy (MOYPE), or Halide Vapour Phase Epitaxy (HYPE), Close Space Vapour Transport (CSVT) or a combination thereof.

19. The process for producing an epitaxial layer of gallium nitride (GaN) according to claim 1, wherein the top GaN layer is doped, n-type or p-type.

20. The process for producing an epitaxial layer of gallium nitride (GaN) according to claim 1, wherein said step of depositing a GaN layer on the substrate further comprises:

depositing a silicon nitride layer functioning as a nanomask on the substrate;

depositing of a buffer layer of GaN;

ramping of the temperature up to the final growth temperature so as to make islands develop;

depositing a GaN layer under epitaxial conditions.

21. The process for producing an epitaxial layer of gallium nitride (GaN) according to claim 1, wherein said process is repeated more than one time.

22. The process for producing an epitaxial layer of gallium nitride (GaN) according to claim 10, wherein the openings are hexagonal shaped.

23. The process for producing an epitaxial layer of gallium nitride (GaN) according to claim 11, wherein the total area of the substrate is between 5 and 50%.

24. The process for producing an epitaxial layer of gallium nitride (GaN) according to claim 17, wherein said carrier gas is an $N_2/H_2$ mixture.

* * * * *

UNITED STATES PATENT AND TRADEMARK OFFICE
CERTIFICATE OF CORRECTION

PATENT NO. : 7,445,673 B2
APPLICATION NO. : 10/556316
DATED : November 4, 2008
INVENTOR(S) : Bernard Beaumont et al.

It is certified that error appears in the above-identified patent and that said Letters Patent is hereby corrected as shown below:

Col. 10, lines 65-67 & col. 11, lines 1-21, should read:

1. A process for producing an epitaxial layer of gallium nitride (GaN) comprising:
   depositing a GaN layer on a substrate;
   depositing a first mask with a plurality of ~~fast~~ <u>first</u> openings forming patterns;
   forming a first regrowth of a gallium nitride layer on the said mask under epitaxial conditions;
   forming a second regrowth of gallium nitride, with a doping agent as an enhancer of lateral growth with respect to the vertical growth so as to induce the deposition of gallium nitride features and anisotropic and lateral growth of said features;
   depositing a second mask with a plurality of second openings forming the same patterns as the first openings exactly above the first ones, providing that the pitch of the pattern of the ~~fast~~ <u>first</u> openings is exactly identical or twice the pitch of the second openings;
   forming a third regrowth of a gallium nitride layer on the second mask under epitaxial conditions;
   forming a fourth regrowth of gallium nitride, with a doping agent as an enhancer of lateral growth with respect to the vertical growth so as to induce the deposition of gallium nitride features and anisotropic and lateral growth of said features.

In Claim 8, at col. 11, lines 50-52, the claim should read:

8. The process for producing an epitaxial layer of gallium nitride (GaN) according ~~to claim~~ to claim 7, wherein the stripes have a width of less than 10μm.

UNITED STATES PATENT AND TRADEMARK OFFICE
CERTIFICATE OF CORRECTION

PATENT NO. : 7,445,673 B2
APPLICATION NO. : 10/556316
DATED : November 4, 2008
INVENTOR(S) : Bernard Beaumont et al.

It is certified that error appears in the above-identified patent and that said Letters Patent is hereby corrected as shown below:

In Claim 18, at col. 12, lines 28-33, the claim should read:

18. The process for producing an epitaxial layer of gallium nitride (GaN) according to claim 1, wherein said second and the fourth regrowth are carried out by Metal Organic Vapour Phase Epitaxy ~~(MOYPE)~~ (MOVPE), or Halide Vapour Phase Epitaxy ~~(HYPE)~~ (HVPE), Close Space Vapour Transport (CSVT) or a combination thereof.

Signed and Sealed this

Twenty-sixth Day of May, 2009

JOHN DOLL
*Acting Director of the United States Patent and Trademark Office*